(12) United States Patent
Hurwitz et al.

(10) Patent No.: US 9,116,171 B2
(45) Date of Patent: Aug. 25, 2015

(54) CURRENT MEASURING APPARATUS

(75) Inventors: Jonathan Ephraim David Hurwitz, Edinburgh (GB); Dale George Frederick Stubbs, Edinburgh (GB)

(73) Assignee: Broadcom Europe Limited, London (GB)

( * ) Notice: Subject to any disclaimer, the term of this patent is extended or adjusted under 35 U.S.C. 154(b) by 275 days.

(21) Appl. No.: 13/509,669

(22) PCT Filed: Nov. 15, 2010

(86) PCT No.: PCT/GB2010/051897
§ 371 (c)(1),
(2), (4) Date: Jun. 6, 2012

(87) PCT Pub. No.: WO2011/058375
PCT Pub. Date: May 19, 2011

(65) Prior Publication Data
US 2012/0313619 A1    Dec. 13, 2012

(30) Foreign Application Priority Data
Nov. 14, 2009  (GB) .................................. 0919969.6

(51) Int. Cl.
*G01R 1/04* (2006.01)
*G01R 15/18* (2006.01)
*G01R 19/00* (2006.01)

(52) U.S. Cl.
CPC .............. *G01R 1/0416* (2013.01); *G01R 15/18* (2013.01); *G01R 19/0092* (2013.01)

(58) Field of Classification Search
None
See application file for complete search history.

(56) References Cited

U.S. PATENT DOCUMENTS

| | | | |
|---|---|---|---|
| 5,068,636 A | 11/1991 | Cavigelli | |
| 6,043,641 A * | 3/2000 | Singer et al. | ................... 324/127 |
| 6,566,854 B1 * | 5/2003 | Hagmann et al. | .......... 324/117 R |
| 2003/0071636 A1 | 4/2003 | Liebler | |
| 2004/0109269 A1 * | 6/2004 | Kawate et al. | ................... 361/42 |
| 2004/0183520 A1 | 9/2004 | Guillon | |
| 2010/0318238 A1 * | 12/2010 | Bryson et al. | ................. 700/298 |

FOREIGN PATENT DOCUMENTS

| | | |
|---|---|---|
| CN | 1106587 A | 8/1995 |
| CN | 2742622 Y | 11/2005 |
| DE | 19739322 A1 | 3/1999 |
| GB | 2174555 A | 5/1986 |
| WO | 99/41616 A2 | 8/1999 |
| WO | WO 2008006521 A1 * | 1/2008 |

OTHER PUBLICATIONS

International Search Report: PCT/GB2010/051897 mailed Jan. 4, 2011, 3 pages.

\* cited by examiner

*Primary Examiner* — Melissa Koval
*Assistant Examiner* — Courtney McDonnough
(74) *Attorney, Agent, or Firm* — Garlick & Markison; Bruce E. Garlick

(57) ABSTRACT

What is disclosed is a current measuring apparatus comprising: a mains connector, such as a plug, for connecting to a wire of a mains supply; an apparatus connector, such as a socket, to provide for electrical conduction to an electrical apparatus; a coil in series between the mains connector and the apparatus connector; and a measurement circuit that is operative to measure a voltage drop across the coil. In particular the coil is one present to also filter the mains signal. Also disclosed is a mains voltage powered consumer product, a network and an adaptor utilizing the current measuring apparatus.

20 Claims, 2 Drawing Sheets

CURRENT MEASURING APPARATUS

FIELD OF THE INVENTION

The present invention relates to current measuring apparatus for measuring current drawn, for example, by a consumer product.

BACKGROUND TO THE INVENTION

Increasing energy costs and an increase in environmental consciousness have given rise to an increase in interest in the monitoring of electricity consumption in the home and the workplace.

Mains current monitoring devices are known. For example, it is known to provide a resistive element in series with a mains connector of a consumer product to provide a measurement of mains current drawn by the consumer product. Such a resistive element is incorporated in the consumer product or forms part of an adaptor that is plugged into a mains socket and to which the consumer product is connected.

It is an object for the present invention to provide an improved current measuring apparatus that is operative to measure current drawn from a mains supply.

STATEMENT OF INVENTION

According to a first aspect of the present invention there is provided a current measuring apparatus comprising:
- a mains connector, which in use of the current measuring apparatus is connected to a wire of a mains supply;
- an apparatus connector, which in use of the current measuring apparatus provides for electrical conduction to an electrical apparatus;
- a coil in series between the mains connector and the apparatus connector; and
- a measurement circuit that is operative to measure a voltage drop across the coil.

It is known to provide a coil in series in at least one of the live and neutral wires of an electrical supply to a consumer product, e.g. in a mains adaptor, to provide for filtering of the mains signal. The present inventors have appreciated that at least one of the coils may be used to measure the current drawn from the mains supply. In use, the measurement circuit is operative to measure the voltage drop across a coil to thereby provide a measure of the current drawn.

More specifically, the mains connector may be one of a live connector, which in use of the current measuring apparatus is connected to a live wire of the mains supply, and a neutral connector, which in use of the current measuring apparatus is connected to a neutral wire of the mains supply.

More specifically, the current measuring apparatus may comprise: first and second mains connectors, which are respectively connected to live and neutral wires of the mains supply; first and second apparatus connectors, which in use of the current measuring apparatus respectively provide a path for live conduction and a path for neutral conduction to the electrical apparatus; a first coil between the first mains connector and the first apparatus connector and a second coil between the second mains connector and the second apparatus connector; and first measurement circuit that is operative to measure a voltage drop across the first coil and a second measurement circuit that is operative to measure a voltage drop across the second coil.

Alternatively or in addition, the measurement circuit may comprise a passive measurement circuit. More specifically, the passive measurement circuit may comprise a measurement coil. The measurement coil may be disposed in relation to the coil such that current passing through the coil is inductively coupled to the measurement coil.

Alternatively or in addition, the measurement coil may have an inductance of less than 100 mH. More specifically, the measurement coil may have an inductance of less than 50 mH. Alternatively or in addition, the measurement coil may have an inductance between substantially 100 mH and substantially 500 µH. Alternatively or in addition, the measurement coil may have an inductance between substantially 50 mH and substantially 10 µH. For example, the measurement coil may have an inductance of substantially 33 mH, substantially 150 pH or substantially 10 µH.

Alternatively or in addition, the measurement circuit may comprise a current to voltage converter, such as a transimpedance amplifier, that is operative to receive current induced in the measurement coil and to convert the received current to a measured voltage, e.g. in the range zero to five volts, for subsequent processing.

Alternatively or in addition, the coil may be an inductor.

Alternatively or in addition, the coil may have an inductance of less than 100 mH. More specifically, the coil may have an inductance of less than 50 mH. Alternatively or in addition, the coil may have an inductance between substantially 100 mH and substantially 500 µH. Alternatively or in addition, the coil may have an inductance between substantially 50 mH and substantially 10 µH. For example, the coil may have an inductance of substantially 33 mH, substantially 150 µH or substantially 10 µH.

Alternatively or in addition, the mains connector may comprise a pin of a mains plug that is configured to be received in a mains socket.

Alternatively or in addition, the apparatus connector may comprise an electrical connection, such as a soldered connection or a connector configured to engage with a wire. The electrical connection may form part of the electrical apparatus, such as a consumer product. Hence, the current measurement apparatus may form part of the consumer product.

Alternatively or in addition, the apparatus connector may be configured to connect to a mains connector of the electrical apparatus. More specifically, the apparatus connector may comprise a socket that is configured to receive a pin of a mains plug forming part of the electrical apparatus. Hence, the current measuring apparatus may be constituted as part of apparatus apart from the electrical apparatus, e.g. as an adaptor having a plug that is configured to be received in a mains socket and at least one adaptor socket that is configured to receive a plug of electrical apparatus, such as a consumer product.

Alternatively or in addition, a mains signal in the context of the present invention may be an AC voltage of 50 VRMS or greater according to standards defined by the International Electrotechnical Commission. Alternatively or in addition, a mains signal may have a frequency of less than 500 Hz, such as a frequency of substantially 60 Hz or substantially 50 Hz for domestic mains or a frequency of substantially 400 Hz for mains in ships.

According to a second aspect of the present invention, there is provided a mains voltage powered consumer product comprising current measuring apparatus according to the first aspect of the present invention.

More specifically, the mains voltage powered consumer product may form part of a network, e.g. the mains voltage powered consumer product may be a multimedia home networking node. In use, the network may be configured to communicate the measured current to another location within the network for display to a user or for storage and subsequent read out to the user. Providing for such networked current measurement may make it more likely that a user of the current measuring apparatus utilises the current measurements compared with the known approach of making measurements and providing read out of current measurements at the consumer product.

Further embodiments of the second aspect of the present invention may comprise one or more features of the first aspect of the present invention.

According to a third aspect of the present invention, there is provided a mains adaptor comprising current measuring apparatus according to the first aspect of the present invention.

The mains adaptor may be operative to change at least one electrical attribute of a mains signal passing through the adaptor. For example, coils provided between first and second mains connectors and first and second apparatus connectors may be operative to provide for filtering of the mains signal passing through the adaptor.

Further embodiments of the third aspect of the present invention may comprise one or more features of the first aspect of the present invention.

BRIEF DESCRIPTION OF DRAWINGS

Further features and advantages of the present invention will become apparent from the following specific description, which is given by way of example only and with reference to the accompanying drawings, in which.

Figure 1:
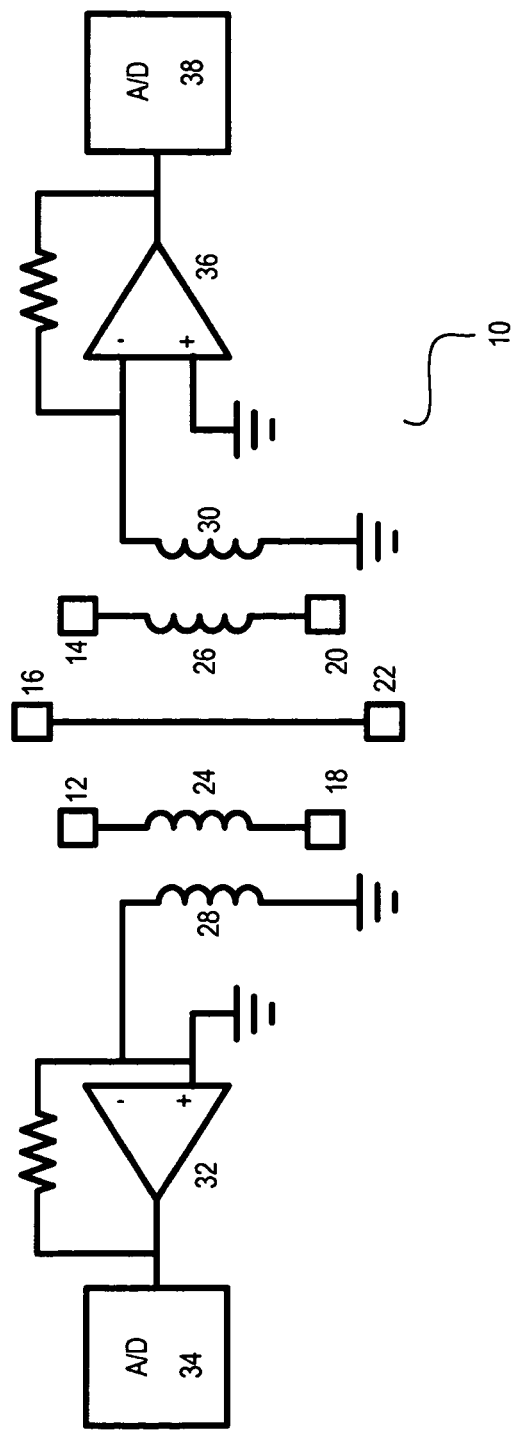
FIG. 1 is diagram of current measuring apparatus according to the present invention.

Current measuring apparatus 10 according to the present invention is shown in FIG. 1. The current measuring apparatus 10 comprises a live pin 12 (which constitutes a mains connector), a neutral pin 14 (which constitutes a mains connector) and an earth pin 16 of a mains plug arrangement that is configured to be received in a socket of a mains supply, e.g. in a residential building. The current measuring apparatus 10 also comprises a live apparatus connector 18, a neutral apparatus connector 20 and an earth apparatus connector 22. In a first form, each of the live apparatus connector 18, the neutral apparatus connector 20 and the earth apparatus connector 22 is constituted as a socket that is configured to receive a pin of a mains plug forming part of a consumer product. Thus, according to the first form the current measuring apparatus 10 forms part of a mains adaptor. In a second form, each of the live apparatus connector 18, the neutral apparatus connector 20 and the earth apparatus connector 22 is constituted as an electrical connection, such as a soldered connection or a connector configured to engage a wire, with the current measuring apparatus 10 forming part of a consumer product. The earth pin 16 and the earth apparatus connector 22 are electrically connected to each other by means of a wire. The live pin 12 and the live apparatus connector 18 are connected to each other by means of a series connected first coil 24 and the neutral pin 14 and the neutral apparatus connector 20 are connected to each other by means of a series connected second coil 26. Each of the first and second coils 24, 26 is of an inductance of substantially 33 mH; the coils are operative to filter the mains power signal received by the mains connector pins of the current measuring apparatus 10.

The current measuring apparatus 10 further comprises a first measurement coil 28. The first measurement coil 28 is disposed in relation to the first coil 24 such that current passing through the first coil 24 is coupled inductively to the first measurement coil 28. Current passing through the first measurement coil is converted to a voltage by means of a first transimpedance amplifier 32 for conversion to a first digital signal by means of a first analogue-to-digital converter 34. The first digital signal corresponds to the current drawn from the live pin 12 of the current measuring apparatus 10. In an embodiment employed depending on the application at hand where it is desired to measure current drawn from the neutral pin 14, the current measuring apparatus 10 comprises a second 30 measurement coil instead of the first measurement coil. In a yet further embodiment where there is a need to detect fault conditions indicated by a difference between the live and neutral currents, the current measuring apparatus 10 comprises a second 30 measurement coil in addition to the first measurement coil. In these embodiments the second measurement coil 30 is disposed in relation to the second coil 26 such that current passing through the second coil 26 is coupled inductively to the second measurement coil 30. Current passing through the second measurement coil is converted to a voltage by means of a second transimpedance amplifier 36 for conversion to a second digital signal by means of a second analogue-to-digital converter 38. The second digital signal corresponds to the current drawn from the neutral pin 14 of the current measuring apparatus 10. Each of the first and second measurement coils 28, 30 has an inductance value of substantially 33 mH.

Figure 2:
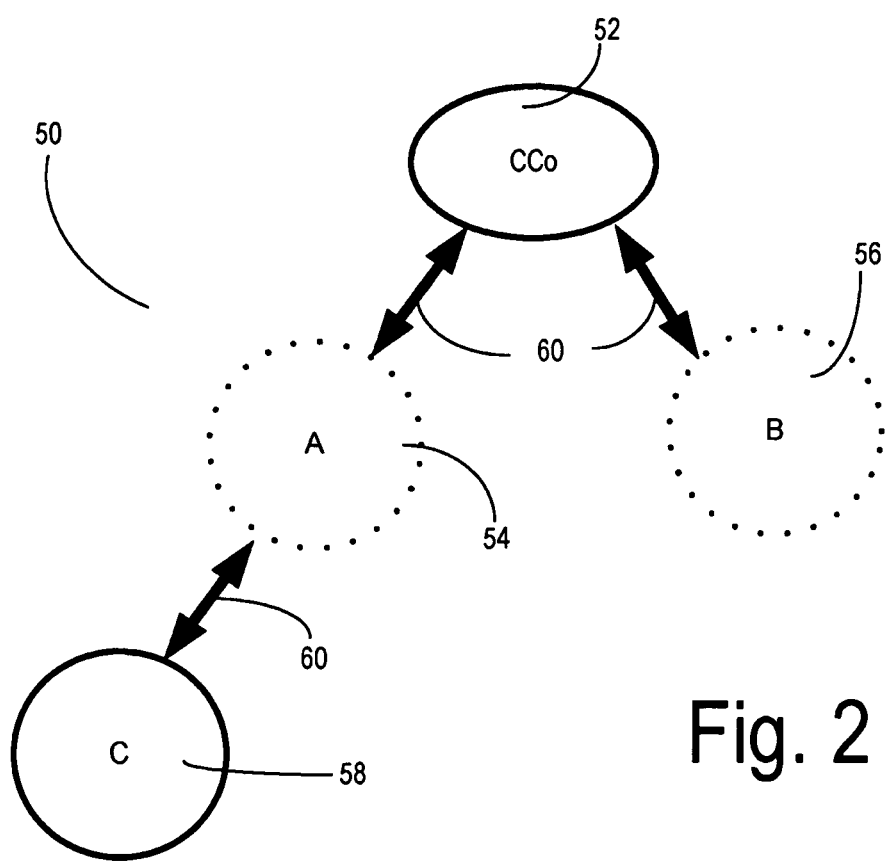
FIG. 2 is a representation of a network of consumer products in a building, which comprise the current measurement apparatus of FIG. 1.

FIG. 2 shows a network 50 of consumer products in a building. The network comprises first 52, second 54, third 56 and fourth 58 nodes. Adjacent pairs of nodes are connected to each other by an already installed communications medium 60, such as mains power wiring, which provides for communication between and amongst a plurality of rooms in the residential building. Thus, for example, each of the first to fourth nodes may be located in a different room of the residential building. Each node comprises a different multi-media device (which constitutes a consumer product). Thus, for example, the first node 52 comprises a Home Gateway (HGW), the second node 54 comprises Personal Computer (PC), the third node 56 comprises audio-visual entertainment apparatus and the fourth node 58 comprises Network Attached Storage (NAS). In the network 50 of FIG. 2 the first node 52 is configured to operate as a communications controller, the second 54 and third 56 nodes are configured to operate as repeater nodes and the fourth node 58 is configured to operate as a standard network node. A communications controller controls the function of the network to which it belongs. Normally there is only one communications controller in a network. A standard node provides for communication of data from the branch of the communications medium leading to the node to the branch of communications medium leading from the node and for communication with the multi-media device connected to the node. A repeater node provides for communication of data from the branch of the communications medium leading to the node to the branch of communications medium leading from the node but provides for no communication with the multi-media device connected to the node, e.g. where the multi-media device is not being used. Referring to FIG. 2, the configuration of the nodes might be such that the HGW connected to the first node is streaming a film from an external source to the network and the NAS connected to the fourth node 18 might be saving the film. Network node apparatus is present at each of the first to fourth nodes 52, 54, 56, 58 of FIG. 2.

The network node apparatus of FIG. 2 comprises a home networking integrated circuit (a GGL541 from Gigle Semiconductors Ltd of Capital House, 2 Festival Square, Edinburgh, EH3 9SU, UK) provided within an appropriate enclosure. The network node apparatus is operative to provide for communication with the consumer product by way of an Ethernet communications controller and with the other nodes in the network over at least one of mains power wiring, co-axial cable and phone line. Reference should be made to publicly available product data from the vendor of the GGL541; such product data provides sufficient information for the skilled person to implement the network shown in FIG. 2 without resorting to any more than ordinary design skill.

According to the second form of the current measuring apparatus described above, the current measuring apparatus forms part of the consumer product at each node in FIG. 2. Thus, the current measuring apparatus is operative to measure the current drawn by each consumer product. The first and second digital signals provided by the first 34 and second 38 analogue-to-digital converters are electrically conveyed by means of the Ethernet connection to the network node apparatus and then transmitted to the communications controller 52 for storage there and subsequent read out to the user. Thus, current measurements are made at each node and conveyed to a central location for ease of reference by the user.

Please note that while "live", "neutral" and "earth" have been named according to United Kingdom convention, the invention is applicable throughout the world, and the skilled person will be able to apply the invention to local naming conventions as appropriate.

The preceding embodiments are provided by way of example only and other variations and embodiments will be apparent to the skilled person without departing from the spirit and scope of the invention.

The invention claimed is:

1. An apparatus comprising:
a mains connector having a live connector and a neutral connector for coupling to a mains supply;
an apparatus connector having a live connector and a neutral connector for coupling to an electrical apparatus;
a first coil in series between the live connector of the mains connector and the live connector of the apparatus connector;
a second coil in series between the neutral connector of the mains connector and the neutral connector of the apparatus connector;
a first measurement circuit configured to measure current in the first coil;
a second measurement circuit configured to measure current in the second coil; and
circuitry configured to determine a fault condition based upon a difference between the current in the first coil and the current in the second coil.

2. The apparatus of claim 1, further comprising:
a current to voltage converter that is configured to convert the measured current in the first coil to a measured voltage;
an analog to digital converter configured to convert the measured voltage to a digital measured voltage; and
communication circuitry configured to communicate the digital measured voltage to a remote device.

3. The apparatus of claim 1, wherein the first measurement circuit comprises a passive measurement circuit.

4. The apparatus of claim 3, wherein the passive measurement circuit comprises a measurement coil.

5. The apparatus of claim 4, wherein the measurement coil and the first coil are inductively coupled.

6. The apparatus of 4, wherein the measurement coil has an inductance substantially between 50 mH and 10 µH.

7. The apparatus of claim 1, wherein the mains connector comprises at least one pin of a mains plug that is configured to be received in a mains socket.

8. The apparatus of claim 1, wherein the apparatus connector comprises an electrical connection configured to engage with the electrical apparatus.

9. The apparatus of claim 8, wherein the electrical connection forms part of the electrical apparatus.

10. The apparatus of claim 1, wherein the apparatus connector comprises a socket that is configured to receive a pin of a mains plug forming part of the electrical apparatus.

11. The apparatus of claim 1, wherein the first coil is further operable to condition the mains supply.

12. The apparatus of claim 1, wherein the first coil is further operable to change at least one electrical attribute of a mains supply signal passing to the apparatus connector.

13. An apparatus comprising:
a mains connector comprising live and neutral mains connectors, which are respectively configured to be connected to live and neutral of a mains supply;
an apparatus connector comprising live and neutral apparatus connectors, which are respectively configured to provide a path for live conduction and a path for neutral conduction to an electrical apparatus;
a first coil coupled between the live mains connector and the live apparatus connector;
a second coil coupled between the neutral mains connector and the neutral apparatus connector.

14. The apparatus of claim 13, wherein the first measurement circuit comprises a passive measurement circuit.

15. The apparatus of claim 14, wherein the passive measurement circuit comprises a measurement coil.

16. The apparatus of claim 13, wherein the apparatus connector comprises an electrical connection configured to engage with the electrical apparatus.

17. The apparatus of claim 13, wherein the mains connector comprises:
a live connector operable to connect to a live connection of the mains supply; and
a neutral connector operable to connect to a neutral connection of the mains supply.

18. The apparatus of 13, wherein the measurement circuit comprises a first measurement coil and a second measurement coil having inductance values substantially between 50 mH and 10 µH.

19. The apparatus of claim 13, wherein the communication circuitry is further configured to communicate the fault condition to the remote device.

20. An apparatus comprising:
a mains connector comprising a live mains connector and a neutral mains connector respectively configured to be connected to live and neutral connections of a mains supply;
an apparatus connector comprising a live apparatus connector and a neutral apparatus connector respectively configured to be connected to live and neutral connections of an electrical apparatus;
a first coil coupled between the live mains connector and the live apparatus connector;
a second coil coupled between the neutral mains connector and the neutral apparatus connector;
a first measurement circuit configured to sense a first current in the first coil;
a second measurement circuit configured to sense a second current in the first coil; and circuitry configured to determine a fault condition based upon a difference between the first current in the first coil and the second current in the second coil.

\* \* \* \* \*